US008943455B2

(12) United States Patent
Chen et al.

(10) Patent No.: US 8,943,455 B2
(45) Date of Patent: Jan. 27, 2015

(54) METHODS FOR LAYOUT VERIFICATION FOR POLYSILICON CELL EDGE STRUCTURES IN FINFET STANDARD CELLS

(71) Applicant: Taiwan Semiconductor Manufacturing Company, Ltd., Hsin-Chu (TW)

(72) Inventors: Shih Hsin Chen, Hsin-Chu (TW); Kai-Ming Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 22 days.

(21) Appl. No.: 13/840,789

(22) Filed: Mar. 15, 2013

(65) Prior Publication Data

US 2014/0282326 A1 Sep. 18, 2014

Related U.S. Application Data

(60) Provisional application No. 61/778,036, filed on Mar. 12, 2013.

(51) Int. Cl.
*G06F 17/50* (2006.01)

(52) U.S. Cl.
CPC .................................. *G06F 17/5081* (2013.01)
USPC ........... 716/119; 716/110; 716/111; 716/118; 716/126

(58) Field of Classification Search
USPC .......................................................... 716/119
See application file for complete search history.

(56) References Cited

U.S. PATENT DOCUMENTS

| | | | | |
|---|---|---|---|---|
| 5,633,524 | A | 5/1997 | Ueda et al. | |
| 7,446,002 | B2 | 11/2008 | Mears et al. | |
| 8,739,104 | B1 * | 5/2014 | Penzes et al. | 716/122 |
| 2008/0185650 | A1 | 8/2008 | Chen et al. | |
| 2011/0055783 | A1 * | 3/2011 | Yang | 716/122 |
| 2012/0053923 | A1 * | 3/2012 | Li et al. | 703/14 |

OTHER PUBLICATIONS

Wright, P., et al., "A DFM Methodology to Evaluate the Impact of Lithography Conditions on the Speed of Critical Paths in a VLSI Circuit," Proceedings of the 7th International Symposium on Quality Electronic Design, 2006, pp. 1-4.

(Continued)

*Primary Examiner* — Jack Chiang
*Assistant Examiner* — Eric Lee
(74) *Attorney, Agent, or Firm* — Slater & Matsil, L.L.P.

(57) ABSTRACT

Methods for standard cells using finFET standard cell structures with polysilicon on OD edges. Standard cells are defined using finFET transistors and having gate structures forming a transistor at an intersection with a semiconductor fin. Polysilicon dummy structures are formed on the edges of the active areas or OD areas of the standard cells. In a design flow, a pre-layout netlist schematic for the standard cells includes a three terminal MOS device corresponding to the polysilicon dummy structure on the edges of the standard cell. After an automated place and route process forms a device layout using the standard cells, a post layout netlist is extracted. Where two standard cells abut one another, a single polysilicon dummy structure is formed on the common boundary. A layout versus schematic comparison is then performed comparing the pre-layout netlist and the post-layout netlist to verify the layout obtained. Additional methods are disclosed.

18 Claims, 8 Drawing Sheets

(56) References Cited

OTHER PUBLICATIONS

Remy,L., et.al., "Definition of an Innovative Filling Structure for Digital Blocks: the DFM Filler Cell," 16th IEEE International Conference on Electronics,Circuits,and Systems, Dec. 2009, pp. 13-16, pp. 73-76.

Thijs,S., et.al., "Design Methodology of FinFET Devices that Meet IC-Level HBM ESD Targets," 30th Electrical Overstress/Electrostatic Discharge Symposium, Sep. 7-11, 2008, pp. 4A.4-1-4A.4-9.

Bhoj, A. N., et al., "Gated-Diode FinFET DRAMs: Device and Circuit Design-Considerations.," ACM Journal on Emerging Technologies in Computing Systems, vol. 6,No. 4,Dec. 2010, pp. 12.1-12:32.

* cited by examiner

METHODS FOR LAYOUT VERIFICATION FOR POLYSILICON CELL EDGE STRUCTURES IN FINFET STANDARD CELLS

This application claims the benefit of U.S. Provisional Application No. 61/778,036 filed on Mar. 12, 2013, entitled "Methods for Layout Verification for Polysilicon Cell Edge Structures in FinFET Standard Cells" which is hereby incorporated herein by reference in its entirety.

CROSS REFERENCE TO RELATED APPLICATION

The present application is related to co-pending U.S. patent application Ser. No. 13/840,221, entitled "Methods for Layout Verification for Polysilicon Cell Edge Structures in FinFET Standard Cells using Filters," filed contemporaneously, commonly assigned to the assignee of the present application, which application is hereby incorporated herein by reference in its entirety.

TECHNICAL FIELD

The embodiments relate generally to the use of finFET transistors to form standard cells for integrated circuits, and more specifically to the methods for layout versus schematic verification for finFET devices used in standard cell methodology when used for producing integrated circuits using automated place and route and design tools.

BACKGROUND

Designing integrated circuits to perform a user-defined function is time consuming and can extend time to market cycles. The use of standard cell libraries with automated placement and routing software tools was developed to shorten the time required to design and verify a new integrated circuit. By using predefined functional blocks that are already implemented as standard cells, the design cycle is shortened. Automated software tools can receive as input a functional description of a desired design in a schematic form and, using algorithms for cell placement and line routing, produce an integrated circuit layout that implements the schematic.

In addition, recent developments in transistor fabrication have replaced the conventional planar metal-oxide-semiconductor (MOS) FET transistor with finFET devices. By forming a three dimensional fin of semiconductor material, and fabricating metal or polysilicon gate structures over the fins, the gate length of the transistor can be longer for a given area, increasing device performance even as the semiconductor processes continue to shrink, and improving density. Standard cell libraries are now implemented using finFET transistors. However, the use of finFET transistors in the standard cell methodologies creates additional problems in verification.

BRIEF DESCRIPTION OF THE DRAWINGS

For a more complete understanding of the illustrative embodiments described herein, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of example illustrative embodiments are discussed in detail below. It should be appreciated, however, that the embodiments provide many applicable inventive concepts that can be embodied in a wide variety of specific contexts. The specific embodiments discussed are merely illustrative of specific ways to make and use the various embodiments, and do not limit the scope of the specification, or the appended claims.

In standard cell design, a user such as an integrated circuit designer uses a set of software tools that taken together, form a design flow. A workstation or personal computer, which can include portable and mobile devices such as laptops and tablets and notebook computers, and even smart phone devices, may be used to interface to the design tools. Shared data files for the design may be stored in non-volatile memory such as disks or flash devices, or on a server coupled to a network or even accessed over an internet portal. These software tools provide a methodology, using the predefined logic cells of the standard cell library, for the user to design a new circuit function to be manufactured as an integrated circuit. The design tools enable the user to simulate the operation of the functional design using digital circuit simulations, to verify the functional design, and then, using the predetermined cell layouts for the standard cells chosen for the design, to automatically place the standard cells together using the gate level netlist schematic obtained from the functional design, to route the interconnections between the standard cells that were placed in the layout, to layout the standard cells and routing interconnections on a semiconductor wafer. A netlist schematic extraction step then creates a layout netlist schematic corresponding to the layout created by the automatic tools.

As is described in more detail below, a layout versus schematic comparison between the layout extracted netlist and the schematic netlist obtained from the functional design is performed. This comparison is made to verify that the automated place and route tools have properly created the layout for the functional design.

The standard cells chosen are selected from a commercially available library that is parameterized to a particular semiconductor manufacturing facility, which may be referred to as a foundry. Because the standard cell library is parameterized, the silicon devices that will be manufactured should operate in a way that closely matches a post-layout simulation performed using a post-layout netlist schematic, which includes RC loading and parasitic device models. In this way the user can quickly create a new integrated circuit and be assured that the silicon obtained from the manufacturer will operate as expected. Software design tools for the standard cell methodology are available commercially from several vendors.

Figure 1:
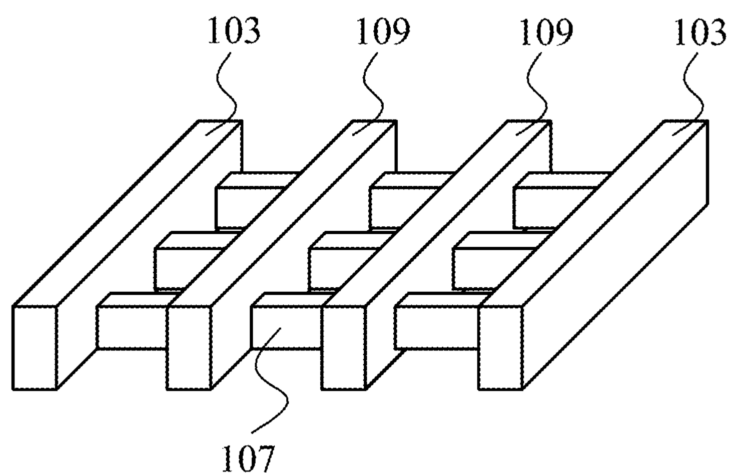
FIG. 1 illustrates in a projection a standard cell device formed with finFET transistors device for use with the embodiments.

FIG. 1 illustrates, in a simplified projection view, a standard cell 100 for use with the various embodiments. The standard cell 100 is implemented using finFET transistors. In finFET transistors, a fin of semiconductor material is formed over an insulating layer. This semiconductor fin can include the source and drain regions for a transistor. The fin may have source and drain doped regions on either side of a channel region, or, in an alternative approach the fin may be uniformly doped. The fins may be formed using silicon on insulator (SOI) technology, or may be patterned from an epitaxial layer of semiconductor material such as silicon. In FIG. 1, fins 107 are arranged in parallel and extending across an active area or "OD" area for the standard cell 100.

The use of standard cells to design integrated circuit provides a method to reduce the design cycle time needed to implement a new function in silicon by using a library of known functional primitive blocks, including for example but without limitation NAND-NAND, NAND-NOR, XOR, AND-OR logical blocks, and other functional blocks such as adders, multiplexers, de-multiplexers, flip-flops, register files, input and output buffers, and the like. Register files, stacks and other data storage blocks can also be part of the library of standard cells. By using a library of blocks that already have a verified layout defined at the transistor level, the need to perform the layout design for each new functional definition for an integrated circuit to be manufactured is eliminated.

Further, by defining the standard cell library using physical cell structures having a predetermined uniform layout pitch, dense packing of the cells can be obtained, so that a very dense placement of the transistors is achieved. Automatic placement and routing tools may be used with the standard cell library and the corresponding predefined layouts of the standard cells to further shorten the time needed to manufacture an integrated circuit that implements a user defined function. The standard cell 100 is one illustrative example of a standard cell formed using finFET transistors.

Gate conductors 109 are shown formed in parallel and intersecting the fins 107 in the standard cell 100. Gate conductors 109 may be polysilicon, such as a doped polysilicon material, for example, formed over the fins. At the intersections between a gate conductor 109 and the semiconductor fins 107, a finFET MOS transistor may be formed by a thin gate dielectric, such as an oxide, nitride or low-k dielectric material formed between the gate polysilicon and the fin. When the finFET MOS transistors are compared to the conventional planar MOS transistors, finFET transistors have an expanded gate width per unit of silicon area because, unlike the planar transistors used previously, the finFET transistors have a gate region that includes the two vertical sides of the semiconductor fin, as well as the horizontal top portion, which greatly increases the gate width but without increasing the surface area of the integrated circuit needed for the device, taking advantage of the three dimensional fin structure. FinFET devices also tend to have higher performance in terms of leakage current, and lower susceptibility to short channel effects. As the devices sizes continue to be reduced with higher performance semiconductor processes, the use of finFET devices is increasing.

Polysilicon structures 103 are formed on the edge of the standard cell 100. These polysilicon on OD edge ("PODE") structures are used to protect the ends of the semiconductor fins during processing. That is, the PODE polysilicon structures 103 are not electrically connected as gates for MOS devices but are instead "dummy" structures, having no function in the circuit. The PODE structures cover and protect the ends of the fins 107 in the cells, providing additional reliability during processing.

Figure 2:
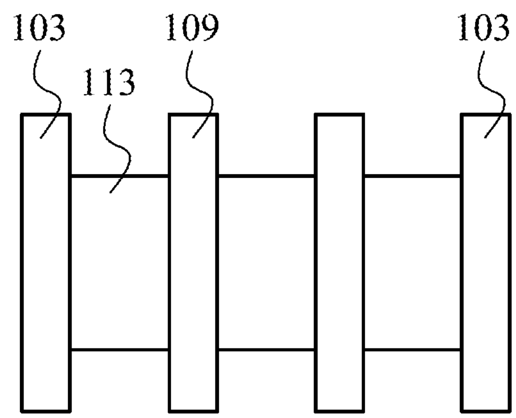
FIG. 2 illustrates in a plan view the standard cell of FIG. 1.

FIG. 2 depicts in a plan view the standard cell 100 of FIG. 1. In FIG. 2, the simplified plan view illustrates the active or OD area 113 for the cell 100, and the polysilicon structures including gates 109 and the PODE structures 103.

Figure 3:
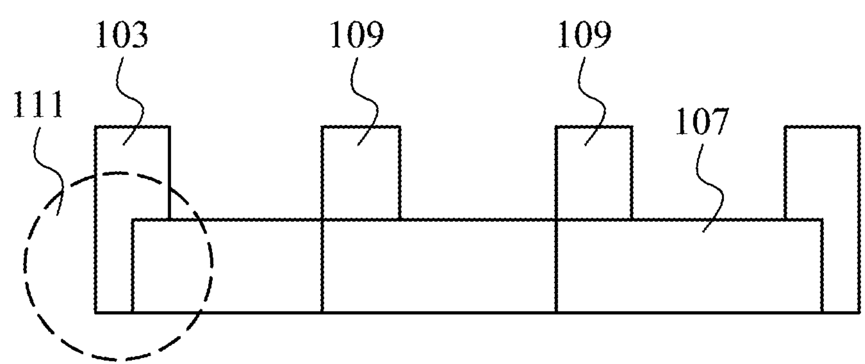
FIG. 3 illustrates in a cross-sectional view a portion of the standard cell of FIG. 1.

FIG. 3 depicts in a cross section a portion of the standard cell 11 shown in FIG. 1. In FIG. 3, the cross section is taken along one of the semiconductor fins 107 shown in FIG. 1. The polysilicon gates 109 are shown intersecting the fin 107; MOS transistors may be formed at the intersections of the fins and the gates. A gate dielectric material such as silicon dioxide, is formed over the fins and lies under the gates 109, but is not shown for simplicity. PODE structures 103 are shown at the edge of the standard cell 100 and protecting the ends of the semiconductor fin 107. Area 111 illustrates the relationship of the PODE 103 and the fin 107.

In a conventional standard cell design flow of the prior art, dummy polysilicon structures like the PODE structure 103 are sometimes modeled simply as unconnected wiring. However, the simulations used with this prior art approach are not accurate, because when polysilicon structures are formed over a portion of an active area, this forms an active device in the silicon produced, and this device adds parasitic capacitance, resistance, and may provide leakage current. Using a "wire" model for the PODE structures results in pre-layout and post-layout simulations that are not accurate. That is, because the models do not reflect the physical device, the simulations also do not accurately predict the performance of the silicon device that is eventually produced from the gate level design.

Figure 4A:
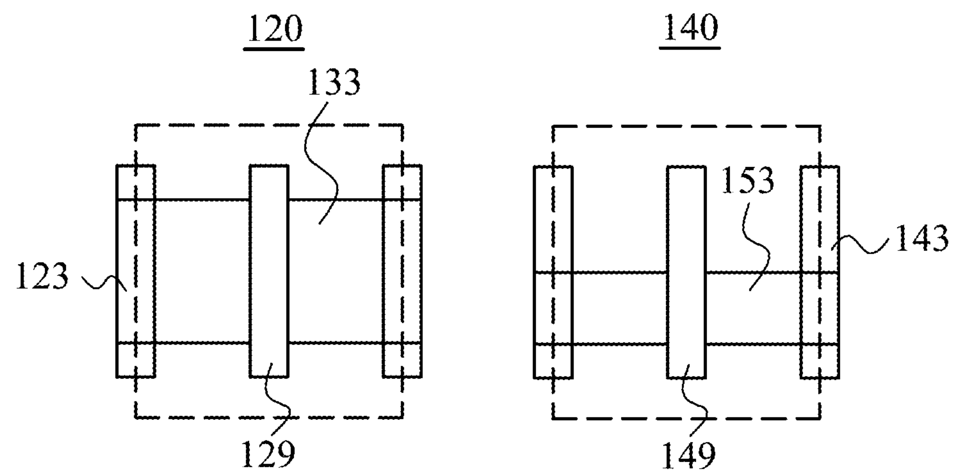
FIG. 4A illustrates in a simplified plan view a pair of standard cells use with the embodiments.
Figure 4B:
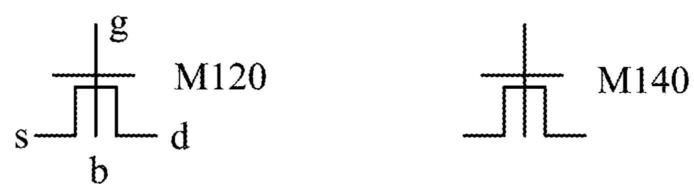
FIG. 4B illustrates a pre-layout simulation model of the pair of standard cells of FIG. 4A.
Figure 4C:
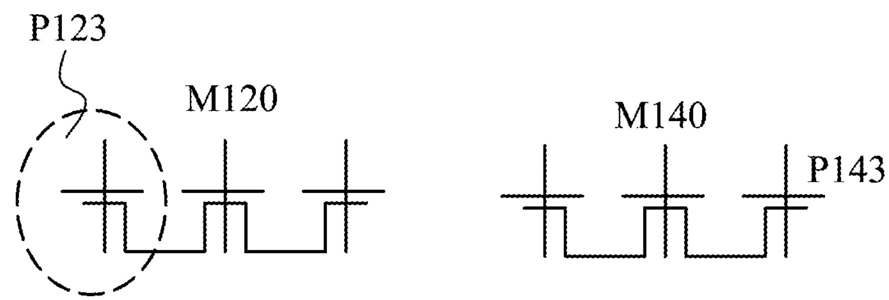
FIG. 4C illustrates a post-layout simulation model of the pair of standard cells including dummy polysilicon on the cell edges.

FIGS. 4A, 4B and 4C illustrate the relationships between standard cell layouts, the pre-layout simulation schematic and the post-layout simulation schematic for example, non-limiting, two standard cells 120 and 140, including PODE structures. These standard cells are examples of cells which may be used with the various embodiments.

In FIG. 4A, in a plan view, standard cell 120, which may be a first sized MOS transistor, is shown with a gate 129 overlying an OD or active area 133. PODE structures 123 are shown at the edges of cell 120. Similarly, standard cell 140 is shown which may be, for example, a smaller sized MOS transistor. A gate 149 is shown overlying an OD or active area 153 with the PODE structures 143 at the edge of cell 140. Note that for a finFET device, the active area may be considered the "fin", but conventionally the active area means an oxide defined or OD area where devices may be formed in the standard cell.

This terminology is used herein; the term "active area" is the OD area for the standard cell. A standard cell may have more than one OD area.

FIG. 4B illustrates a pre-layout simulation schematic for the standard cells 120 and 140. Essentially, in this simplified example, each of the standard cells 120 and 140 provides a single MOS transistor. In FIG. 4B, a transistor model M120 is shown for the standard cell 120 M140 for the standard cell 140. These "netlist1" models may be used to perform functional simulation of the device, for example. No parasitic information or layout related parameters are used in the pre-layout simulation. Note that the two cells 120 and 140 differ in the size of the active areas, so that the two transistors M120 and M140 may have different drive strengths, for example. These simple standard cells are presented here merely for illustration, and other standard cells in various embodiments may include additional transistors.

FIG. 4C illustrates a post-layout simulation model schematic for the standard cells 120 and 140. As shown in FIG. 4C, the use of the dummy polysilicon structures 123 and 143 as shown in FIG. 4A, the PODE structures, creates capacitive loading as shown in the post-layout simulation models, as P123 for the polysilicon 123, and P143 for the polysilicon 143. As seen in FIG. 4C, each of the structures adds a three terminal device, or 3T device, to the schematic. The PODE structure 123 appears as a polysilicon gate over a source region and having a body terminal, so that three terminals—source, gate and body, are formed. The same is true for the P143 structure in the model for standard cell 140.

Figure 5A:
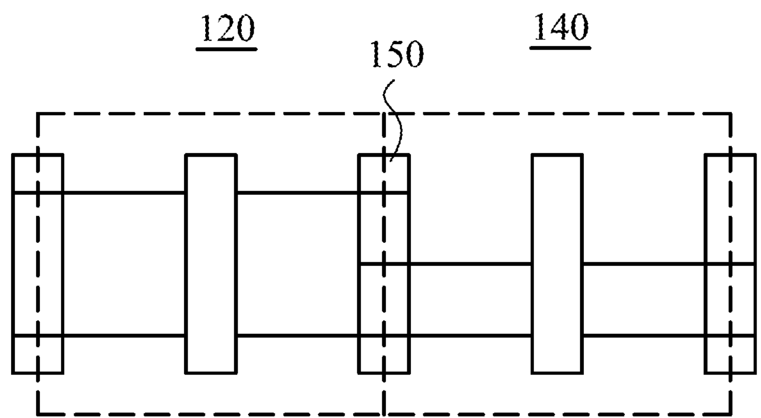
FIG. 5A illustrates in a simplified plan view the pair of standard cells of FIG. 4A after an abutment operation is used in an example embodiment.
Figure 5B:
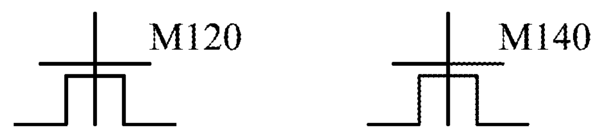
FIG. 5B illustrates a pre-layout simulation model schematic of the pair of standard cells of FIG. 5A.
Figure 5C:
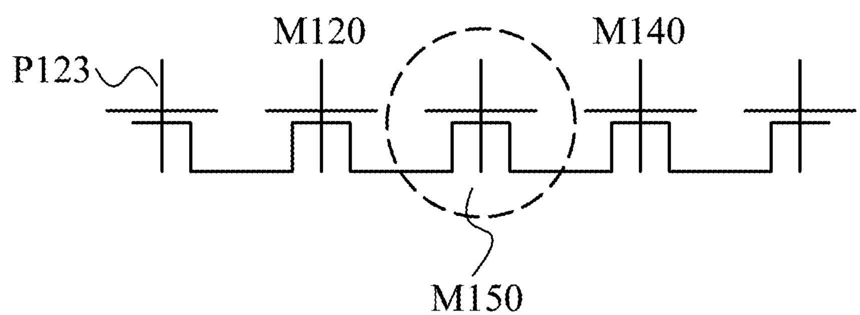
FIG. 5C illustrates a post-layout simulation model for the pair of standard cells of FIG. 5A, including an abutted dummy polysilicon on a shared cell edge portion.

FIGS. 5A, 5B and 5C illustrate the standard cells 120 and 140 shown in FIGS. 4A, 4B and 4C above after an abutment placement process is performed. Because the PODE structures at two adjacent standard cells, such as 120 and 140 in FIGS. 4A, 4B and 4C, can be shared, the place and route tools are designed to abut these adjacent cells by forming a single PODE structure at the common boundary of the two cells. This cell abutment process increases packing density of the standard cells on the integrated circuit by removing redundant structures and sharing the edge polysilicon structures between the two cells.

As shown in FIG. 5A, standard cells 120 and 140 are now abutted and a common PODE structure 150 is shown at the shared cell boundary. In FIG. 5B, the pre-layout simulation model schematics are shown for each cell 120 and 140, each provides a single MOS transistor M120, and M140; and the models in FIG. 5B do not include the PODE structures.

FIG. 5C depicts a post-layout simulation schematic that may be extracted from the layout of FIG. 5A including the capacitive loading of the PODE structures such as 123, 133, 143 of FIG. 4A. As shown in FIG. 5C the shared abutment PODE structure 150 forms what appears in a schematic view as another MOS device M150. The polysilicon 150 forms a gate overlying an active area and having a source on one side and a drain on the opposing side and a body terminal, so in the schematic sense it is just like the transistors M120 and M140. However, in fact the PODE 150 is a dummy structure, and the gate of polysilicon 150 should be tied to substrate to avoid signal conflicts in the design verification process so that no functional transistor will actually be formed.

In a conventional standard cell design flow, a layout versus schematic (LVS) comparison step is performed between a functional schematic determined from a Verilog or HDL netlist schematic of the design to be manufactured, and compared to a second schematic that is extracted from the device layout created by the automated place and route tools. This comparison is referred to as the "LVS" or layout versus schematic compare. The purpose of the LVS is to ensure that the functional design netlist, which was created by a user to define the particular circuit function to be performed by the integrated circuit that is to be manufactured, is the same as the layout netlist that is extracted from the layout created by the automated place and route software tools. In this manner, the layout used in making the integrated circuit is known to match the designed netlist. That is, if the two netlists match, the layout is then verified as correct.

However, if the pre-layout models in the design netlist do not include the PODE structures, the LVS compare will not match, because the post-layout netlist will then include elements (the PODE structures) not found in the pre-layout netlist schematic. This can be seen by comparing FIGS. 4B and 4C, above, and FIGS. 5B and 5C above. In order to use the PODE structures of the embodiments in a standard cell methodology, a new method is needed to ensure the LVS tool will show a match between the desired gate level netlist and the layout. Some modifications are needed to correctly perform layout versus verification, or LVS, including the PODE structures of the finFET standard cells.

Figure 6A:
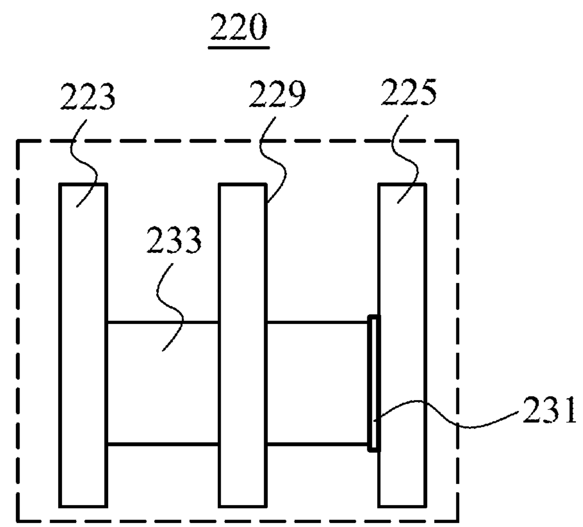
FIG. 6A illustrates in another plan view a layout for a standard cell of an embodiment.
Figure 6B:
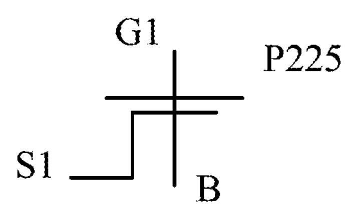
FIG. 6B illustrates a three terminal device for use with the schematic netlist for the standard cell in FIG. 6A.

FIGS. 6A and 6B illustrate a standard cell of one of the embodiments. In FIG. 6A, again a plan view of a standard cell 220 is shown with a gate structure 229 intersecting and overlying an active area or OD area 233. Transistors may be formed where the gate 229 overlies an active area, and in various embodiments, a standard cell such as 220 may include multiple active areas, although in this simplified example, only one active area 233 is depicted. The fins in a finFET standard cell such as shown in FIG. 1 provide the active areas. In one example, a CMOS standard cell may include a fin for forming a NMOS finFET transistor and a second fin for providing a PMOS finFET transistor, in this manner a single cell can provide the two transistors needed for a CMOS inverter, which is a commonly used element in standard cell designs.

FIG. 6A also includes a portion 231 which is a recognition layer. The purpose of this structure is to modify the netlist that will be obtained in the "netlist1" or the pre-layout schematic netlist that is used to model the cell. In the various embodiments, the added recognition layer next to the PODE structures (such as recognition layer 231 next to the PODE structure 225 in FIG. 6A) will cause the design tools to extract a three terminal device representing the capacitive loading that the PODE structure 225 contributes to the design. When this device, shown in FIG. 6B as P225, is included in the pre-layout schematic netlist, and subsequently the layout extracted schematic is compared to the pre-layout schematic in an LVS tool, the two netlist schematics will both have the PODE structure P225. Thus, there will be an LVS match. By using the embodiments, the PODE structures may be utilized and the existing design tools such as existing LVS tools will operate correctly, without requiring any modifications.

Figure 7A:
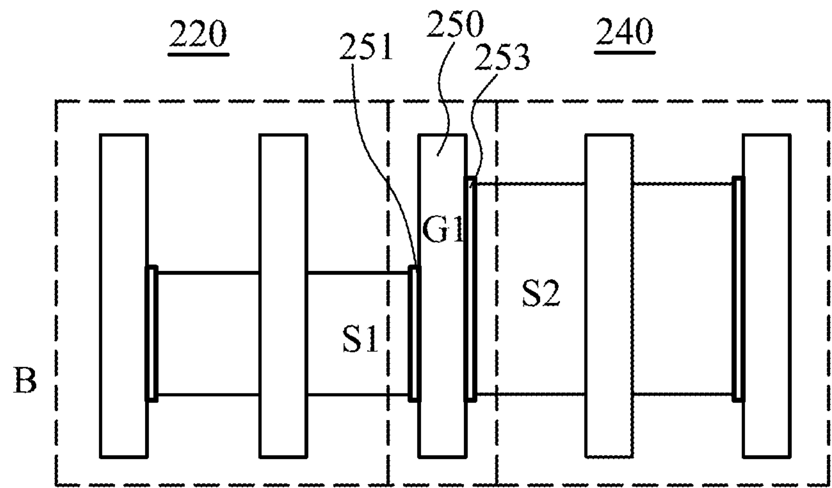
FIG. 7A illustrates in a plan view a layout for a pair of standard cells for use with the embodiments.
Figure 7B:
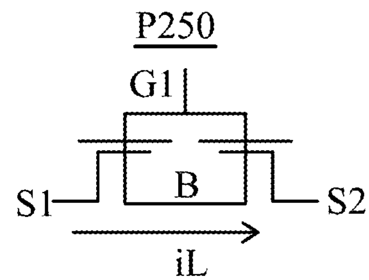
FIG. 7B illustrates a pre-layout schematic netlist portion for the shared dummy polysilicon structure of the cells in FIG. 7A.

FIGS. 7A and 7B illustrate in a plan view and a schematic view the functional netlist schematic for two of the standard cells of an embodiment where the cells are abutted together. In FIG. 7A, the cells 220 and 240 are depicted and a common PODE polysilicon gate structure 250 is shown where the cells abut one another. As described above, the PODE structures are dummy structures and the gate G1 will not be connected to anything electrically. However, the structure appears as two FET devices coupled together, as shown in FIG. 7B, these devices are MOS transistors with a common gate connection G1, and a common body connection B, and each having a source region S1, and S2 respectively. The schematic elements are then two 3 terminal devices coupled together with a common gate and common body connection.

Returning to FIG. 7A, by including in the standard cell definition a recognition layer 251 and 253 on each side of the PODE structure 250, the schematic that is extracted when the cells are used will correctly show the two three terminal devices in structure P250. By adding the recognition structures 251 and 253 to the standard cells, the layout versus schematic comparison will operate correctly because the layout schematic that is extracted will also have the same P250 structure with two MOS devices in it. Further, because the embodiment standard cells include the PODE structures in both the pre-layout and post-layout netlist schematics, the LVS tool will operate correctly without modification of the existing software tool when using the embodiments.

Figure 7C:
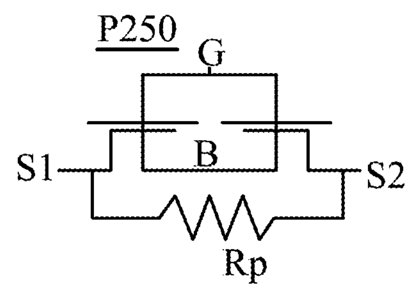
FIG. 7C illustrates the post-layout schematic for the shared dummy polysilicon structure in FIG. 7B.

Another characteristic of the various embodiments is illustrated in FIG. 7C. As shown in FIG. 7A, when the two standard cells 220 and 240 are placed in an abutting arrangement, a common PODE structure 250 is formed at the abutting edge where the cell edge polysilicon structures are combined into one, and as explained above a structure P250 is extracted in the pre-layout netlist schematic, as shown in FIG. 7B. In the actual integrated circuit, there will be current flowing between the source terminals S1 and S2 shown as $i_L$ in FIG. 7B. In order for the simulations used in the design tools to work correctly, this current should be modeled in the layout parametric extraction (LPE) data used with the post-layout simulation netlist. The post-simulation netlist with the layout parametric data is used for accurate loading, timing, rise and fall time and delay modeling. This post-layout simulation netlist may be used with a SPICE program, for example, to confirm the completed integrated circuit will operate to the desired electrical specifications.

However, in conventional design rule manual (DRM), the design rules are written so that it is not permitted to leave the gate terminal of a dummy MOS device unconnected, because that would cause signal conflicts when S1 and S2 have different voltage. Accordingly, the gate of device P250 will be shut off (coupled to ground). The PODE device P250 will then have a linear I-V leakage current. In the embodiments, this linear I-V characteristic is advantageously modeled using a resistor. Accordingly, in the various embodiments, a parasitic resistor may be used to model the behavior of the device P250 in the LPE netlist.

This is feature shown in FIG. 7C. By adding the parasitic resistor Rp to the PODE structure P250 in the extracted LPE netlist for the layout, a correct estimate of the RC loading delay contributed by the PODE structure 250 is then provided for use in the post-layout simulation tools. However, advantageously with the use of the embodiments, the layout versus schematic or LVS tool does not compare parasitic resistors to the pre-layout schematic netlist obtained from the gate level netlist, because the parasitic devices are not present at the functional level. Accordingly the LVS tool will compare the 3 terminal devices which are present in both netlists, and the LVS software will verify the design and the layout at the compare step, without requiring any modification to the existing LVS software. In this manner, the leakage current is modeled for the P250 structure of FIGS. 7A-C, without the need for modifying the commercial design tool software programs.

Use of the embodiments advantageously provides a correct LVS compare for standard cells using the polysilicon on OD edge (PODE) dummy structures. Further, by adding the recognition layers to the standard cell definitions, the pre-layout simulation netlists will more accurately reflect the loading and delays on the nets, and increased accuracy timing simulations are then possible. Modeling the PODE dummy structures at the abutting edges as a 3T+R device further improves the post-layout simulation netlist, as the parasitic resistor closely models the linear I-V curve for the leakage current that will flow at the PODE structures formed where two cells abut one another.

Note that by providing the recognition layers at the boundaries of the active area and the dummy polysilicon regions, in the embodiment standard cells the abutment process does not change the schematic model for the standard cell. That is, irrespective of which standard cell is abutted with the first standard cell such as 220 above, the PODE structures used are not changed from the ones that would be used for the cell alone. Thus, the LVS process in the design tools using the embodiments does not incur any large computational overhead when the abutted cells are created by the layout tools, because the three terminal devices that are used in the extracted netlists are not changed by the abutting of the standard cells, the three terminal devices are just coupled together as shown above. The use of the embodiments thus advantageously provides the standard cells in a manner that the computation time for the design tools is not increased substantially over the prior art. The addition of a recognition layer in the standard cell at the boundary between the active areas and the PODE structure allows the layout netlists to be extracted hierarchically, and the run time needed for the LVS compare is not negatively affected.

Figure 8:
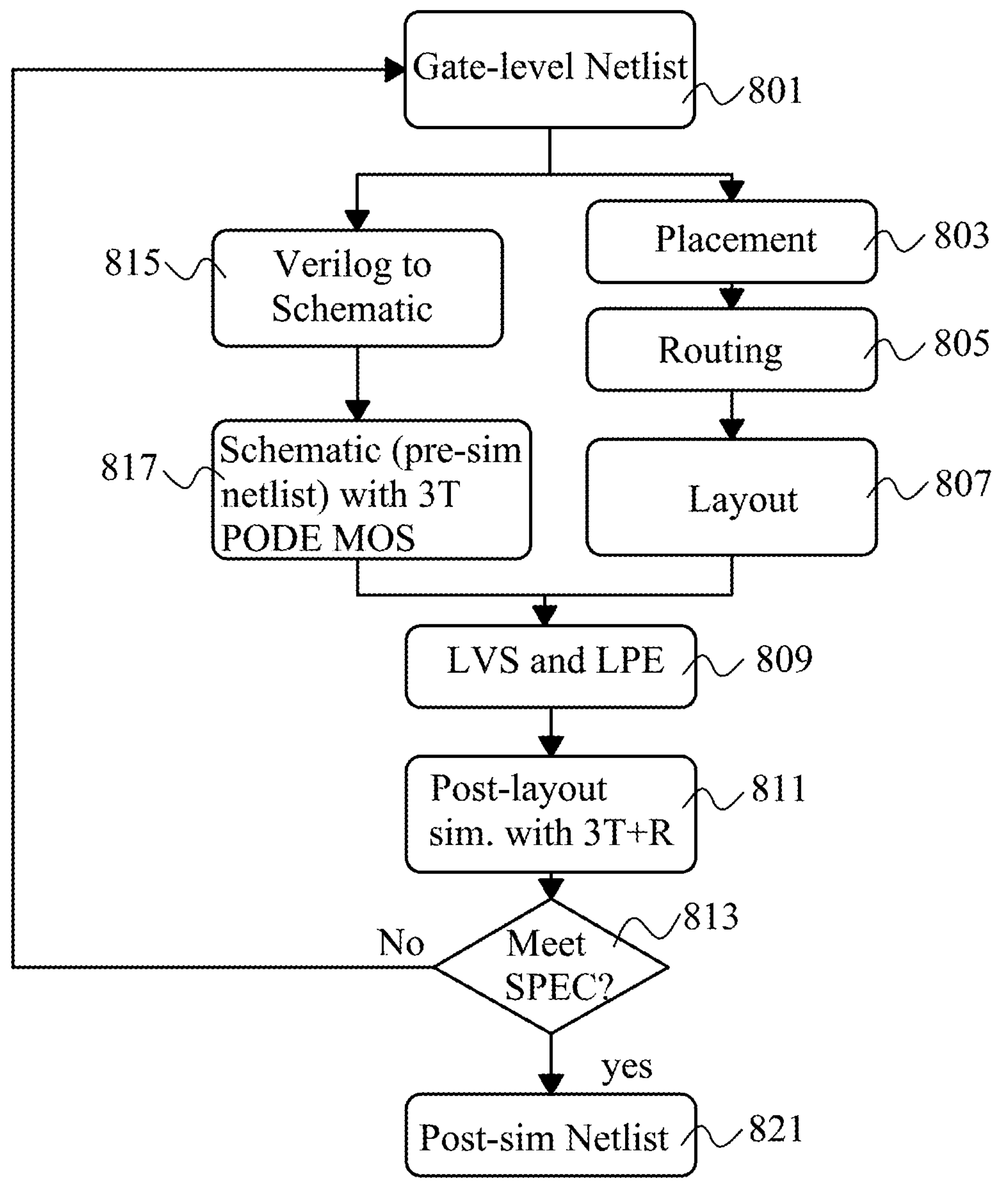
FIG. 8 illustrates in a flow chart view a method for use with the various embodiments.

FIG. 8 depicts, in a simplified flow diagram, a method for use with the various embodiments in a novel standard cell design methodology for implementing a desired circuit described as a netlist. A gate level netlist is provided that defines the circuitry to be implemented using the standard cell approach, this is used as input to the method in the flow chart, and this is step 801. At steps 815 and 817, this gate level netlist is transformed to a schematic form. In one example, the original netlist may be provided in a register-transfer language or other simulation language for circuit design, such as Verilog. A transformation program then transforms the Verilog into a schematic form. At step 817, the schematic is transformed into a pre-layout simulation netlist. At step 817, using the standard cells of the embodiments, the polysilicon on OD edge (PODE) dummy structures are shown in the netlist as 3 terminal or 3T devices, which are MOS devices, however the gate terminals are not connected, as the PODE structures are dummy structures.

In step 803, an automated placement tool creates a transistor level design using the gate level netlist and placing standard cells from a standard cell library to form the various logic and functional blocks from the gate level netlist. This automated placement tool can be an existing commercial software tool such as is provided by Cadence or Synopsys, for example.

During placement, as described above, when the standard cells are abutted against one another, a common PODE structure is formed with an active area on either side of it as shown for example in FIG. 7A.

At step 805, an automatic routing tool then determines the connections needed between the devices in the standard cells, such as MOS transistors, for example, to implement the gate level netlist. Multiple transistors are coupled together to form adders, multiplexers, registers and the like in the routing step.

Once the routing is determined, automated layout tools are used at step 807 to map the standard cells and the interconnections from the router onto a semiconductor device using the process rules, and the design rules, that are provided. All of these software tools are available commercially and may be purchased. Standard cell libraries that are parameterized for certain semiconductor wafer manufacturing facilities, for example, for Taiwan Semiconductor Manufacturing Company (TSMC), are also available.

At step 809, the layout is verified as correct. This is done by extracting a layout schematic from the layout provided at step 807, and then performing the layout versus schematic (LVS) comparison which compares each element in the layout schematic to the pre-layout schematic obtained from step 817.

If the design tools have correctly operated on the gate level netlist, the two schematics should match. The schematic obtained from the layout of the standard cells using the embodiments includes the recognition layers shown in FIG. 7A, for example, and at each polysilicon on OD edge structure, the schematic extracted from the layout will include a 3 Terminal device such as P123 in FIG. 5C. Where two standard cells are abutted together, the layout schematic will include two of the three terminal devices coupled together as for device P250 in FIG. 7C, for example. The comparison in the LVS is then comparing the same elements for both the pre-layout schematic netlist, and the post-layout schematic netlist, where ever the PODE structures are present in the standard cells of the embodiments.

Also at step 809, the layout parametric extraction (LPE) is performed. This extraction provides RC loading information, and includes parasitic devices that are not used in the LVS comparison. The LPE data is then added to the layout schematic to form a post-layout simulation netlist which includes information needed to simulate delays, loading, timing, rise and fall times, current hogging, current hot spots, and other electrical characteristics needed to confirm proper electrical performance of the circuit layout implemented using the standard cells.

At step 811, the post-layout simulation can be performed. The post-layout simulation netlist includes the LPE data for the parasitic resistors, such as Rp, from the abutted PODE structures that form where two of the standard cells are abutted together as in FIG. 7A.

At step 813, a design performance check is performed. If the simulation shows that the design meets the desired electrical performance, then the method continues using the post-simulation netlist at step 821 and a photomask generation tape (PG tape) may be output for the design at step 823. If the design fails to meet the desired specifications, iteration is performed and the gate level netlist must be modified in a manner to address the areas of the design that fail to meet the specification.

Once the PG file (conventionally this data file was called "PG-tape" but the data files may be stored in any number of formats of non-transitory tangible media for use by a photomask generation facility, including tape, but more likely non-volatile storage forms or at web based storage servers) is output at step 823, photomasks may be fabricated for use in manufacturing the design as an integrated circuit using semiconductor wafer processing.

The following example netlist files are provided to illustrate the use of the embodiments in a simple example, such as shown in FIG. 7A, where two standard cells using the PODE structures abut one another. In the netlist files, the first cell provides an MOS device M0, and the second cell provides another MOS device M1, and there are PODE structures at each end, and an abutting PODE structure at the common boundary, such as shown in FIG. 7A.

The pre-layout simulation netlist schematic, which is a functional simulation netlist without parasitic and layout effects, is provided as Table 1:

Sample Schematic (LVS)

TABLE 1

```
.subckt nch_mac_rnpode G1 G2 G3 G4 G5 S1 S2 S3 B
M0 S1 G2 G1 B nch_mac
M1 S3 G4 S2 B nch_mac
X2 G1 G1 B npode_mac          <-- 3T PODE device
X3 S1 G3 B npode_mac          <-- 3T PODE device
X4 S2 G3 B npode_mac          <-- 3T PODE device
X5 S3 G5 B npode_mac          <-- 3T PODE device
.ends
```

The corresponding post-layout schematic, which includes the LPE layout parameters and the parasitic resistors, including the 3T devices used in the embodiments, is provided in Table 2:

Sample Netlist (LPE)

TABLE 2

```
.subckt nch_mac_rnpode G1 G2 G3 G4 G5 S1 S2 S3 B
XM0 S1 G2 G1 B nch_mac
XM1 S3 G4 S2 B nch_mac
X2 G1 G1 B npode_mac          <-- 3T PODE device
X3 S1 G3 B npode_mac          <-- 3T PODE device
X4 S2 G3 B npode_mac          <-- 3T PODE device
X5 S3 G5 B npode_mac          <-- 3T PODE device
X6_noxref S1 S2 rnpode        <-- resistor
.ends
```

As can be seen from examining the two netlists, the two netlists each include the 3 terminal devices that model the PODE structures in the standard cells, and each netlist is identical—except for the resistor in the LPE post-layout netlist in Table 2. However, as explained above, the layout versus schematic (LVS) comparison does not consider the resistor and so, the comparison of the two netlists, the pre-layout netlist of Table 1, and the post-layout netlist of Table 2, will show an LVS match, which is the correct result.

As an additional advantage obtained in the various embodiments, the pre-layout simulation netlist includes the 3T devices that correspond to the PODE structures, increasing the accuracy of any simulation results obtained using that netlist. Further, the post-layout simulation netlist includes the parasitic resistor, and so the leakage current of the PODE structure between the two cells, such as shown in FIG. 7B above, is correctly modeled in the post-layout simulation, increasing the accuracy of any results obtained for that simulation.

Use of the embodiments advantageously provides a standard cell with polysilicon on OD edge (PODE) structures, for example in various embodiments the PODE structures are advantageously used with finFET MOS devices, and the various embodiments are compatible with IC standard cell design flows using commercially available automated design tools. The addition of the 3T MOS devices for the PODE structures in the pre-layout simulation netlists allows the capacitance contributed by the PODE structures, which are dummy structures, to be considered in pre-layout simulation results, and increased simulation accuracy is obtained. The use of a parasitic resistor to model the leakage current for the PODE structure in abutted standard cells increases the post-layout simulation accuracy while the layout versus schematic comparison is not affected.

In an embodiment, a method is disclosed including defining standard cells including at least one transistor and polysilicon dummy structures formed on cell edges; forming a pre-layout schematic netlist from an input gate level netlist using the standard cells, wherein the pre-layout schematic netlist includes a three terminal device corresponding to each of the polysilicon dummy structures; using the gate level netlist, performing an automated place and route process to form a layout netlist for fabricating an integrated circuit using the standard cells; laying out the standard cells and laying out routing connections between the standard cells to form a layout for the integrated circuit, using the layout netlist; extracting from the layout for the integrated circuit a post-layout netlist schematic, the post-layout netlist schematic including a three terminal device for each polysilicon dummy structure in the layout netlist; and comparing the pre-layout netlist to the post-layout netlist.

In an additional embodiment, the above method further includes during the automated place and route, where two of the standard cells are placed adjacent to one another, forming an abutted polysilicon dummy structure at a common boundary that is shared by the two adjacent standard cells. In a further embodiment, in the above methods, adding to the post-layout netlist a resistor that models a leakage current of the abutted polysilicon dummy structure. In still another embodiment, in the above methods, for each abutted polysilicon dummy structure in the layout, providing in the post-layout netlist schematic a pair of three terminal devices each having a gate terminal that is coupled one to another and each having a body terminal that is coupled one to another. In still another embodiment, performing the above methods wherein the three terminal devices each comprise a MOS device with a source, gate and body terminal. In yet a further embodiment, performing the above methods and further comprising performing a layout parameter extraction process on the layout netlist, adding parasitic resistance and capacitance to the post-layout netlist. In still a further embodiment, in the above methods, further performing a simulation of the electrical performance of the integrated circuit using the post-layout netlist.

In yet another embodiment, in the above methods, wherein the standard cells each further comprise at least one finFET device. In still another embodiment, in the above methods, wherein at least one of the standard cells further comprises at least two finFET devices.

In a further embodiment, a method for fabricating an integrated circuit includes defining a library of functions implemented as standard cells including finFET devices; in each standard cell, forming polysilicon dummy structures on cell edges overlying at least a portion of a fin of the finFET devices; defining a netlist schematic for each standard cell that includes a three terminal MOS device that corresponds to each of the polysilicon dummy structures; receiving a gate level netlist that defines a desired function to be implemented as an integrated circuit using the standard cells; forming a pre-layout schematic netlist using the standard cells, the pre-layout schematic including a three terminal MOS device for each of the polysilicon dummy structures in the standard cells; using the gate level netlist, performing an automated placement and route process to create a layout netlist implementing the user defined function using the standard cells; performing a layout to implement the layout netlist on an integrated circuit; extracting a post-layout schematic netlist from the layout, the post-layout schematic including a three-terminal MOS device corresponding to each polysilicon dummy structure in the layout; comparing the pre-layout schematic netlist to the post-layout schematic netlist to obtain a compare result; and responsive to the compare results, fabricating an integrated circuit by forming a photomask generation output from the post-layout schematic.

In still another embodiment, the above method includes after obtaining the compare results, extracting layout parametric data from the layout and adding the layout parametric data to the post-layout netlist; and using the layout parametric data and the post-layout netlist, performing a simulation to determine whether the integrated circuit design meets predetermined electrical characteristics.

In yet another method embodiment, the above methods include determining that the integrated circuit design fails to meet the predetermined electrical characteristics; and modifying the gate level netlist.

In yet another embodiment, when the above methods are performed, during the automated placement and route, for each pair of standard cells that are adjacent one another, forming a shared polysilicon dummy structure in the layout at a common boundary of the two standard cells. In still another embodiment, in the above methods, for each of the shared polysilicon dummy structures, the post-layout extracted netlist includes two three terminal MOS devices each having a gate terminal, a source terminal and a body terminal and the gate terminals are coupled to one another, and the body terminals are coupled to one another. In yet another embodiment of the above methods, for each of the shared polysilicon dummy structures, the post-layout schematic netlist includes a resistor that models a leakage current corresponding to the shared polysilicon dummy structure. In still another method embodiment, during the comparison of the pre-layout schematic netlist to the post-layout schematic netlist, the resistor is not compared.

In another method embodiment, forming an integrated circuit includes receiving a gate level netlist defining a function for the integrated circuit; defining a standard cell library of predetermined blocks formed using finFET standard cells, each of finFET standard cells comprising at least one semiconductor fin, at least one polysilicon gate, and dummy polysilicon structures at one or more cell edges, the dummy polysilicon structures overlying a portion of the at least one semiconductor fin; from the gate level netlist, forming a pre-layout netlist schematic using the standard cells, the pre-layout netlist schematic having a three terminal MOS device with a gate terminal, a source terminal and a body terminal for each of the dummy polysilicon structures; using the gate level netlist, performing automated placement and routing of the standard cells to implement the function for the integrated circuit, and providing a layout netlist; forming a layout for implementing the function on the integrated circuit using the standard cells; extracting a post-layout schematic netlist from the layout, the post-layout schematic netlist including a three terminal MOS device for each dummy polysilicon structure in the layout; and verifying the layout by performing a layout versus schematic compare that compares the pre-layout schematic netlist to the post-layout schematic netlist. In still another method, embodiment during the automated placement and routing, for adjacent ones of the standard cells, forming an abutted dummy polysilicon structure at a common boundary of adjacent ones of the standard cells. In yet another method embodiment, for the abutted dummy polysilicon structures, the post-layout netlist schematic includes a pair of three terminal MOS devices each having a gate, a source and a body terminal, and the gate terminals are coupled together, and the body terminals are coupled together. In still another embodiment, in the above methods, providing, for each of the abutted dummy polysilicon structures, a resistor in the post-layout schematic netlist, the resistor modeling a leakage current for the abutted polysilicon structure.

Although the example embodiments have been described in detail, it should be understood that various changes, substitutions and alterations can be made herein without departing from the spirit and scope of the application as defined by the appended claims. These devices, steps and materials may be varied while remaining within the scope of the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. A method, comprising:

defining standard cells including at least one transistor and polysilicon dummy structures formed on cell edges;

forming a pre-layout schematic netlist from an input gate level netlist using the standard cells, wherein the pre-layout schematic netlist includes a three terminal device corresponding to each of the polysilicon dummy structures;

using the gate level netlist, performing an automated place and route process to form a layout netlist for fabricating an integrated circuit using the standard cells;

laying out the standard cells and laying out routing connections between the standard cells to form a layout for the integrated circuit, using the layout netlist;

extracting using a computer from the layout for the integrated circuit a post-layout schematic netlist the post-layout schematic netlist including a three terminal device for each polysilicon dummy structure in the layout netlist, wherein, for each abutted polysilicon dummy structure in the layout, providing in the post-layout schematic netlist a pair of three terminal devices each having a gate terminal that is coupled one to another and each having a body terminal that is coupled one to another; and comparing the pre-layout schematic netlist to the post-layout schematic netlist.

2. The method of claim 1, and further comprising:

while performing during the automated place and route, where two of the standard cells are placed adjacent to one another, forming an abutted polysilicon dummy structure at a common boundary that is shared by the two adjacent standard cells.

3. The method of claim 2, and further comprising adding to the post-layout schematic netlist a resistor that models a leakage current of the abutted polysilicon dummy structure.

4. The method of claim 1, wherein the three terminal devices each comprise a MOS device with a source, gate and body terminal.

5. The method of claim 1, and further comprising performing a layout parameter extraction process on the layout netlist, adding parasitic resistance and capacitance to the post-layout schematic netlist.

6. The method of claim 5 and further comprising performing a simulation of the electrical performance of the integrated circuit using the post-layout schematic netlist.

7. The method of claim 1, wherein the standard cells each further comprise at least one finFET device.

8. The method of claim 1, wherein at least one of the standard cells further comprises at least two finFET devices.

9. A method for fabricating an integrated circuit, comprising:

defining a library of functions implemented as standard cells including finFET devices;

in each standard cell, forming polysilicon dummy structures on cell edges overlying at least a portion of a fin of the finFET devices;

defining a netlist schematic for each standard cell that includes a three terminal MOS device that corresponds to each of the polysilicon dummy structures;

receiving a gate level netlist that defines a desired function to be implemented as an integrated circuit using the standard cells;

forming a pre-layout schematic netlist using the standard cells, the pre-layout schematic netlist including a three terminal MOS device for each of the polysilicon dummy structures in the standard cells;

using the gate level netlist, performing an automated placement and route process to create a layout netlist implementing the user defined function using the standard cells;

performing a layout to implement the layout netlist on an integrated circuit;

extracting a post-layout schematic netlist from the layout, the post-layout schematic netlist including a three-terminal MOS device corresponding to each polysilicon dummy structure in the layout, wherein for each shared polysilicon dummy structure, the post-layout extracted schematic netlist includes two three terminal MOS devices each having a gate terminal, a source terminal and a body terminal and the gate terminals are coupled to one another, and the body terminals are coupled to one another;

comparing the pre-layout schematic netlist to the post-layout schematic netlist to obtain a compare result; and responsive to the compare results, fabricating an integrated circuit by forming a photomask generation output from the post-layout schematic.

10. The method of claim 9, and further comprising, after obtaining the compare results, extracting layout parametric data from the layout and adding the layout parametric data to the post-layout schematic netlist; and using the layout parametric data and the post-layout schematic netlist, performing a simulation to determine whether the integrated circuit design meets predetermined electrical characteristics.

11. The method of claim 10, and further comprising:

determining that the integrated circuit design fails to meet the predetermined electrical characteristics; and modifying the gate level netlist.

12. The method of claim 9, wherein during the automated placement and route, for each pair of standard cells that are adjacent one another, forming a shared polysilicon dummy structure in the layout at a common boundary of the two standard cells.

13. The method of claim 9, wherein for each of the shared polysilicon dummy structures, the post-layout schematic netlist includes a resistor that models a leakage current corresponding to the shared polysilicon dummy structure.

14. The method of claim 13, wherein during the comparison of the pre-layout schematic netlist to the post-layout schematic netlist, the resistor is not compared.

15. A method for forming an integrated circuit, comprising:

receiving a gate level netlist defining a function for the integrated circuit;

defining a standard cell library of predetermined blocks formed using finFET standard cells, each of finFET standard cells comprising at least one semiconductor fin, at least one polysilicon gate, and dummy polysilicon structures at one or more cell edges, the dummy polysilicon structures overlying a portion of the at least one semiconductor fin;

from the gate level netlist, forming a pre-layout schematic netlist using the standard cells, the pre-layout schematic netlist having a three terminal MOS device with a gate terminal, a source terminal and a body terminal for each of the dummy polysilicon structures;

using the gate level netlist, performing automated placement and routing of the standard cells to implement the function for the integrated circuit, and providing a layout netlist;

forming a layout for implementing the function on the integrated circuit using the standard cells;

extracting using a computer a post-layout schematic netlist from the layout, the post-layout schematic netlist including a three terminal MOS device for each dummy polysilicon structure in the layout; and verifying the layout by performing a layout versus schematic compare that compares the pre-layout schematic netlist to the post-layout schematic netlist.

16. The method of claim 15, and further comprising:

during the automated placement and routing, for adjacent ones of the standard cells, forming an abutted dummy polysilicon structure at a common boundary of adjacent ones of the standard cells.

17. The method of claim 16, wherein for the abutted dummy polysilicon structures, the post-layout schematic netlist includes a pair of three terminal MOS devices each having a gate, a source and a body terminal, and the gate terminals are coupled together, and the body terminals are coupled together.

18. The method of claim 17, and further comprising providing, for each of the abutted dummy polysilicon structures, a resistor in the post-layout schematic netlist, the resistor modeling a leakage current for the abutted polysilicon structure.

* * * * *